(12) United States Patent
Eckardt

(10) Patent No.: US 6,580,284 B1
(45) Date of Patent: Jun. 17, 2003

(54) METHOD AND APPARATUS FOR DETERMINING AN OPERATING STATE OF A MOTOR WHICH IS CONNECTED TO A RIGID NETWORK

(75) Inventor: Dieter Eckardt, Herzogenaurach (DE)

(73) Assignee: Siemens Aktiengesellschaft (DE)

( * ) Notice: Subject to any disclaimer, the term of this patent is extended or adjusted under 35 U.S.C. 154(b) by 18 days.

(21) Appl. No.: 09/988,977

(22) Filed: Nov. 19, 2001

(51) Int. Cl.$^7$ ................................................. G01R 31/34
(52) U.S. Cl. ........................................ 324/772; 310/109
(58) Field of Search ............................... 324/158.1, 177, 324/772; 310/109; 318/7, 43, 51, 151, 490, 599, 671; 166/66.4; 417/45

(56) References Cited

FOREIGN PATENT DOCUMENTS

| DE | 4434275 | * | 9/1994 |
| DE | 19736004 | * | 8/1997 |
| EP | 0240684 | * | 2/1987 |
| EP | 0675369 | * | 3/1995 |
| EP | 0698975 | * | 2/1996 |

OTHER PUBLICATIONS

Wissenschaftliche Tagungen der Technischen Universitat, Karl–Marx–Stadt 3/1989, 10. International Fachtagung Industrielle Automatisierung–Automatisierte Antriebe IL210:Z195 Industrielle Automatisier Bd. 10 1989 Budig, P.-K (Hrsg.), pp. 282–285.*

Fischer, Rolf: Elektrische Maschinen; ISBN 3-446-14562-1.

* cited by examiner

Primary Examiner—Kamand Cuneo
Assistant Examiner—Trung Nguyen
(74) Attorney, Agent, or Firm—Baker Botts LLP

(57) ABSTRACT

The invention relates to a method and an apparatus (2) for determining an operating state of a motor (4) which is connected to a rigid network (6) and has a rotation speed sensor. According to the invention, phase voltages ($u_1$, $u_2$, $u_3$) of the rigid network (6) which are applied to the connecting terminals (L1, L2, L3) of the motor (4) are used to determine its frequency ($f_N$) and amplitude ($U_1$), a measured shaft rotation speed (n) and a number of pole pairs (p) of the motor (4) are used to determine the slip (s) of the motor (4) as a function of the determined network frequency (fn), and the mechanical shaft power ($P_{mech}$) is calculated as a function of this slip (s), of the determined amplitude ($U_1$), of an internal voltage ($U_{11}$) in the motor (4) and of motor-specific parameters ($X_1$, $X_2$, $X_h$, $R_2$, $R_1$, $R_{fe}$, σ). A method which is independent of power is thus obtained for determining an operating state of a motor (4), without any need to detect the actual current value.

33 Claims, 7 Drawing Sheets

METHOD AND APPARATUS FOR DETERMINING AN OPERATING STATE OF A MOTOR WHICH IS CONNECTED TO A RIGID NETWORK

FIELD OF THE INVENTION

The invention relates to a method and an apparatus for determining an operating state of a motor which is connected to a rigid network and has a rotation speed sensor.

The operating point of a motor connected to a rigid network is, for example, the mechanical shaft power which the motor emits to a machine that is being driven by it. For example, this mechanical shaft power which is emitted from the motor and the maximum permissible mechanical shaft power for the machine which is being driven by it can be compared in order to identify whether the machines that are being driven are in a correct state. The operating state may also comprise, for example, the actual rotation speed, the mechanical shaft power and further information.

BACKGROUND OF INVENTION

A device and a method for correct electronic processing of operating data for an electrical motor are known from European Laid-Open Specification 0 240 684. The motor operating data include, for example, the rotation angle, the rotation speed, the rotation acceleration, the torque, the power, the thermal load, the motor voltage and the motor current. In this Laid-Open Specification, the motor current is monitored as the particularly indicative parameter of the load on the motor. This motor current is detected by means of a current sensor, for example a current transformer, in the supply line to the motor, is digitized, and is supplied to a central processor unit. This processor unit uses a program that is stored in the program memory to continually check the arriving actual values of the motor current for compliance with predetermined limit values and, furthermore, records switch-on, changeover and switch-off processes. The processor unit allocates to such selective operating data data relating to the absolute time of their occurrence, and stores such data in a data memory. The power supply for the device is designed such that it can operate autonomously and operationally reliably. This device is expediently associated solely with the electric motor for a lengthy time, preferably for its entire life or operating time, that is to say the device cannot be used simultaneously or successively for different motors, in order to obtain clear relationships for the reconstruction of the motor biography. Since the motor current is used here, this device is power-dependent. This means that the current transformer must be replaced if the motor current rises.

A universal circuit concept which comprises functional modules which can also be connected individually is known from the specialist report "Intelligenter Motorschutz" [Intelligent motor protection], by Dietrich Amft and Peter Waber, printed in the tenth International Symposium "Industrielle Automatisierung—automatisierte Antriebe", [Industrial automation—automated drives], at the [Karl-Marx-Stadt Chemnitz] Technical University, from Feb. 14 to 16, 1989. Converter/transducer assemblies for detecting the motor supply line currents, analog/digital converters, an assembly for determining the motor temperature via winding sensors, a computer assembly for temperature calculation, a communication interface, a filter assembly for assessing current harmonics, a core-balance current transformer assembly, a function input, a display and a power supply assembly are provided as a functional module. The computer assembly has a single-chip microprocessor. The set current, actual current and temperature as well as coded faults can be indicated via the display. A warning is produced when the current actual value is greater than 80% to 100% of the rated value or, on the other hand, delayed tripping takes place if the rated value is exceeded.

An on-line diagnosis system for rotating electrical machines is known from EP 0 675 369 B 1, by means of which the state and the maintenance requirement for a machine are diagnosed. This system has a number of motor sensors which monitor different physical parameters and produce appropriate electrical signals. Signal converters/transducers convert the electrical signals to appropriate digital values. These values are collected by a processor, which compares these values, or a trend of the values, with predetermined basic values or trends. The processor then makes recommendations for the motor servicing interval, in order to ensure optimum performance and availability, with minimal costs and a minimal down time.

SUMMARY OF INVENTION

The invention is now based on the object of specifying a method and an apparatus for determining an operating state of a motor which is connected to a rigid network, which method is independent of power.

According to the invention, this object is achieved by the features of claim 1 and claim 12.

Since the phase voltages which are applied to the connecting terminals of the motor are evaluated rather than the current flowing in the motor in order to determine an operating state of a motor which is connected to a rigid network and has a rotation speed sensor, the method and the apparatus can be used for any motor, irrespective of the motor rating. The frequency and amplitude of these network voltages are determined and are used, in conjunction with a determined shaft rotation speed, the number of pole pairs in the motor and motor-specific parameters, to calculate the mechanical shaft power as an operating state. The phase voltages of the rigid network are not measured directly for this method, with the frequency and amplitude of these phase voltages which are applied to the connecting terminals of the motor being evaluated instead.

Since these phase voltages of the rigid network which are applied to the connecting terminals are only evaluated for the apparatus for determining an operating state, the apparatus does not require any voltage transformers. Since neither current nor voltage transformers are required for the apparatus, the design of this apparatus is independent of the rating of the associated motor. This apparatus can thus be used virtually independently of power.

The apparatus is subdivided into an analog evaluation circuit and a digital computation unit. The analog evaluation circuit is used to evaluate the frequency and the amplitude of the phase voltages of a rigid network which are applied to the connecting terminals of the motor. The digital computation unit uses the determined frequency and amplitude values, the measured shaft rotation speed, the number of pole pairs in the associated motor and motor-specific parameters to determine an operating state, for example the mechanical shaft power. Since the analog evaluation circuit has few components and the digital computation unit may preferably be one component, the wiring complexity is minimal. Furthermore, the physical volume that is occupied is minimal.

The inventive step is that the phase voltages of a rigid network which are applied to the connecting terminals of the motor are used for determining an operating state of a motor which is connected to this network. This means that current transformers are not used since their designs are related to power, which means that different apparatuses, which are subdivided into rating classes, must be provided for motors having different ratings.

The operating state of a motor is governed not only by a single value, for example the mechanical shaft power, but can also be composed of a number of values.

In one advantageous method, the time sequence of determined voltage sections of the phase voltages of the rigid network which are applied to connecting terminals of the motor is evaluated in order to determine the rotation direction of the network at the connecting terminals of the motor. The rotation direction of the network at the connecting terminals of the motor governs the rotation direction of the motor. Since the rotation direction can be determined from the phase voltages that are applied, a simple bar encoder or toothed wheel encoder, which cannot identify the rotation direction, is sufficient for use as the rotation speed sensor.

It is possible for a situation to arise in which one phase of the rigid network fails at the motor, for whatever reasons, so that a temperature sensor must be fitted to each winding, or must be inserted in it, for reliable protection of the winding of the motor against overtemperature, if no phase failure identification is provided. Phase failure identification allows the number of temperature sensors to be reduced to one, which is inserted into any of the motor windings.

In a further advantageous method, the time sequence of determined voltage sections of the phase voltages which are applied to connecting terminals of the motor is evaluated, and the amplitude of these voltage sections is evaluated, in order to determine a phase failure in the network.

In a further advantageous method, the measured temperature of the stator and a thermal model of the motor are used to determine the temperature of the rotor. Calculation of the temperature of the rotor means that it is now possible to use temperature-dependent parameters to correct the rotor resistance. The stator resistance can be used for this parameter in the same way, in which case the measured stator temperature is used directly in the correction calculation.

In one advantageous apparatus for determining an operating state of a motor, the analog evaluation circuit has a polyphase diode bridge, which is provided on the output side with an RC element and a device for suppressing any DC component. Furthermore, a high-value resistance is connected electrically in parallel with the RC element in order that a ripple signal derived from the rectified network voltage is produced at the output of the device for suppressing any DC component. The digital computation unit uses this ripple signal to determine the network frequency.

In a further advantageous embodiment of the apparatus for determining an operating state of a motor, a number of trigger circuits are used instead of the device for suppressing any DC component, and these are each connected on the input side to an input of the polyphase diode circuits, and on the output side to an input of the digital computation unit. The use of the trigger circuit considerably improves the frequency determination. Furthermore, this makes it easier to determine a phase failure, since the time sequence of the determined voltage drops across the diodes in the lower bridge arm of the polyphase diode bridge, and the amplitude of these determined voltage drops, are now evaluated.

In a further advantageous embodiment of the apparatus for determining an operating state of a motor, an optocoupler is used instead of each trigger circuit, and these optocouplers are in each case electrically connected in series with the diodes in the lower diode arm of the diode bridge. In this way, the current conduction times of the diodes in the lower diode arm of the diode bridge are determined with DC decoupling.

In one particularly advantageous embodiment, an electrical switch is connected electrically in series with the high-value resistor which is connected electrically in parallel with the RC element in the analog evaluation circuit, and this electrical switch is connected on the control side to the digital computation unit, with this connection having an optocoupler for DC isolation. This switch is used to connect the high-value resistor only at specific times. The power loss in this high-value resistor is reduced as a function of the duty ratio. If the switch is synchronized to the natural commutation times of the polyphase diode bridge, it is also possible to determine the network frequency, in addition to determining any phase failure. Furthermore, the power losses caused by the high-value resistor are then minimal. This pulsed high-value resistor can also be used in the other embodiments if there is an aim to design the apparatus for determining an operating state of a motor to have low losses.

Advantageous refinements of the apparatus according to the invention for determining an operating state of a motor which is connected to a rigid network are described in the dependent claims 12 to 30.

BRIEF DESCRIPTION OF THE DRAWINGS

In order to explain the invention further, reference should be made to the drawing, which schematically illustrates a number of embodiments of the apparatus according to the invention for determining an operating state of a motor which is connected to a rigid network.

DETAILED DESCRIPTION OF THE INVENTION

Figure 1:
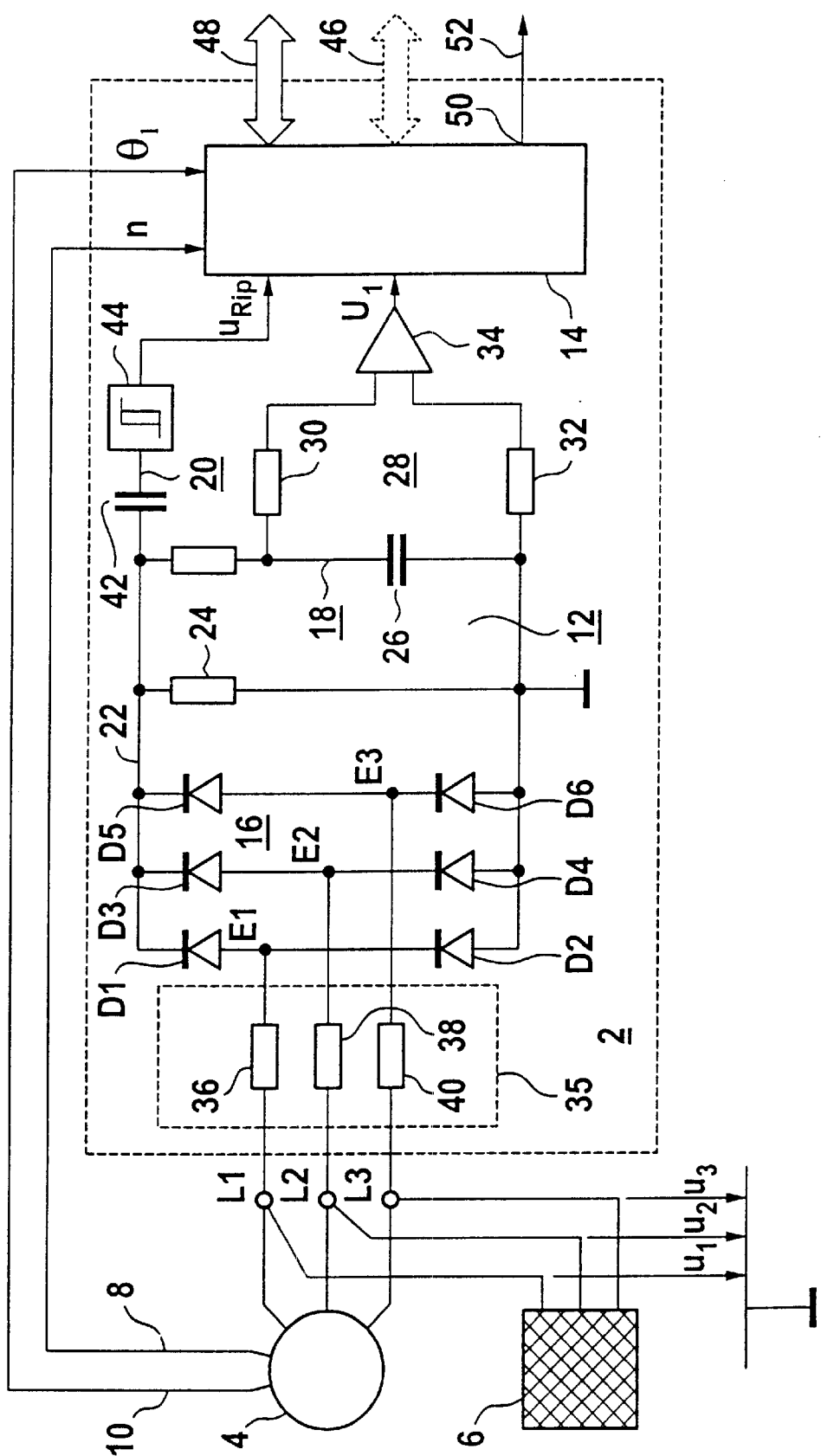
Figure 2:
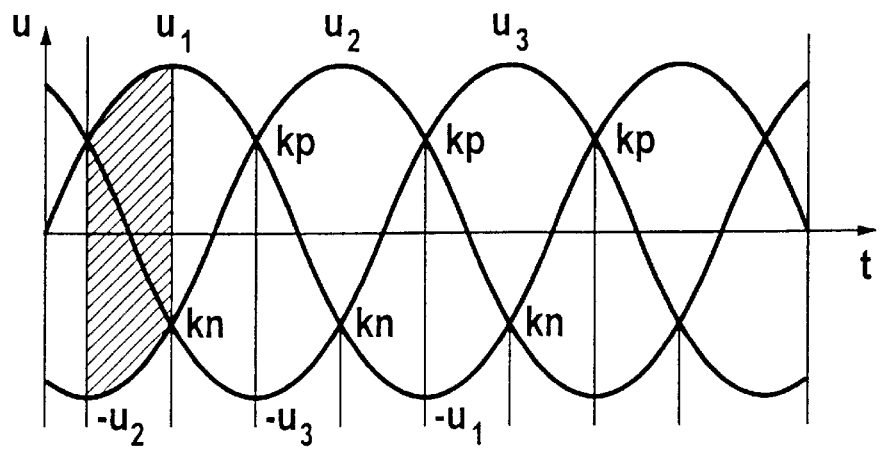
Figure 6:
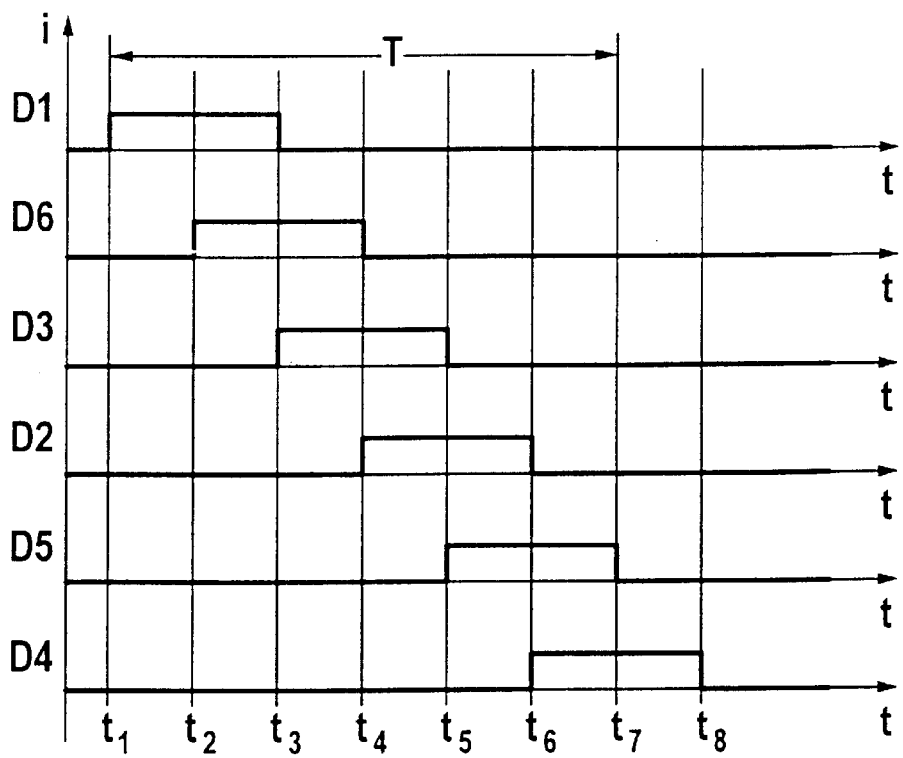
Figure 3:
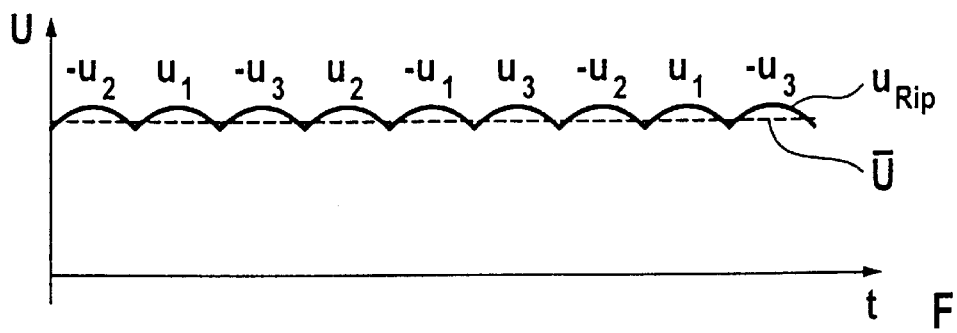
Figure 4:
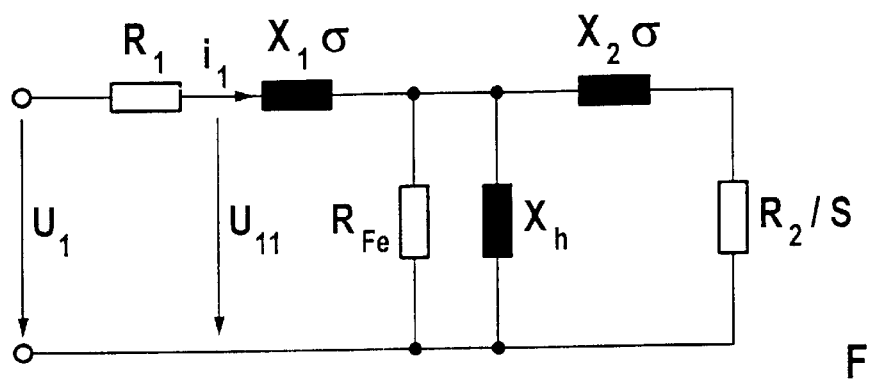
Figure 9:
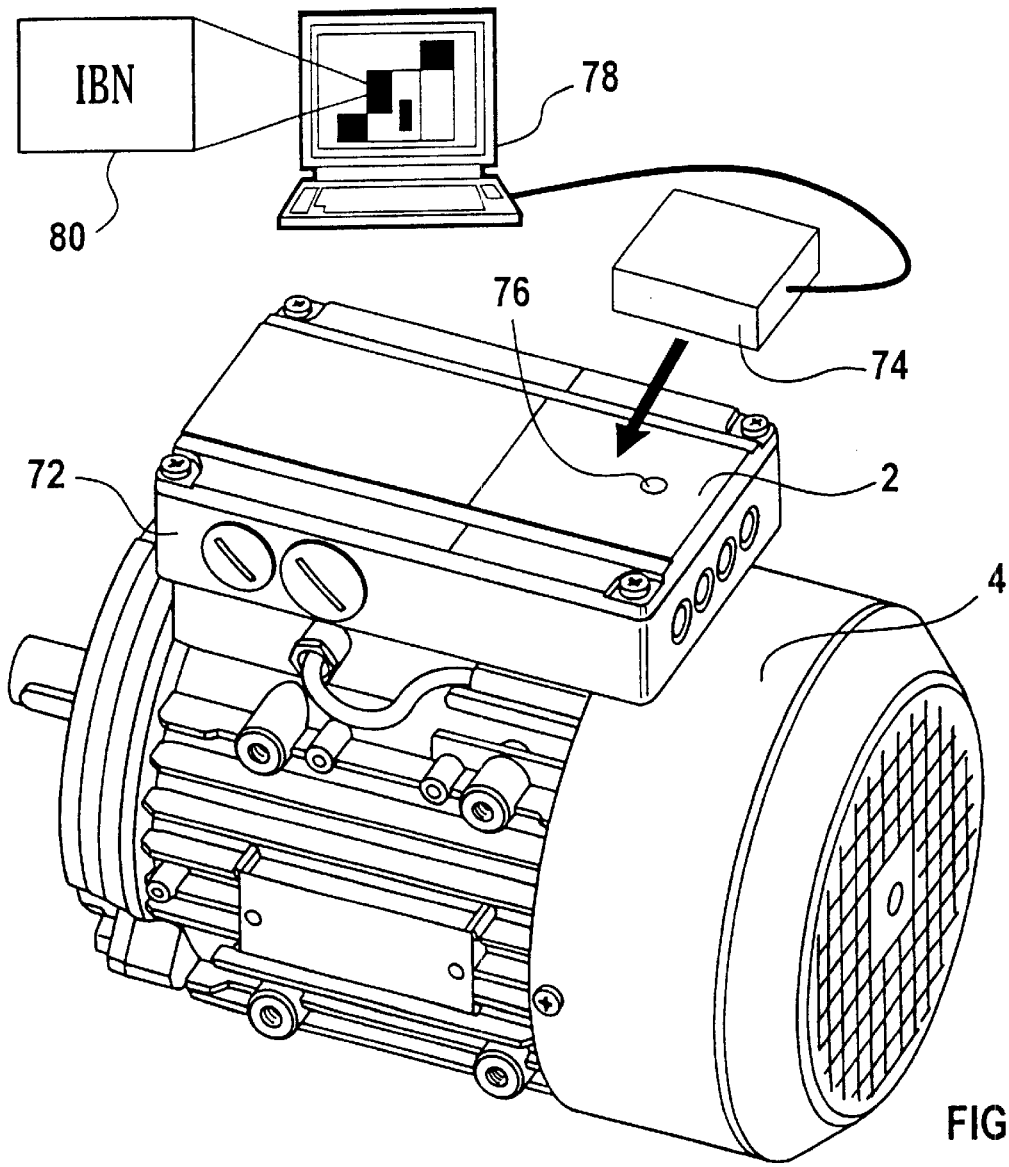
Figure 5:
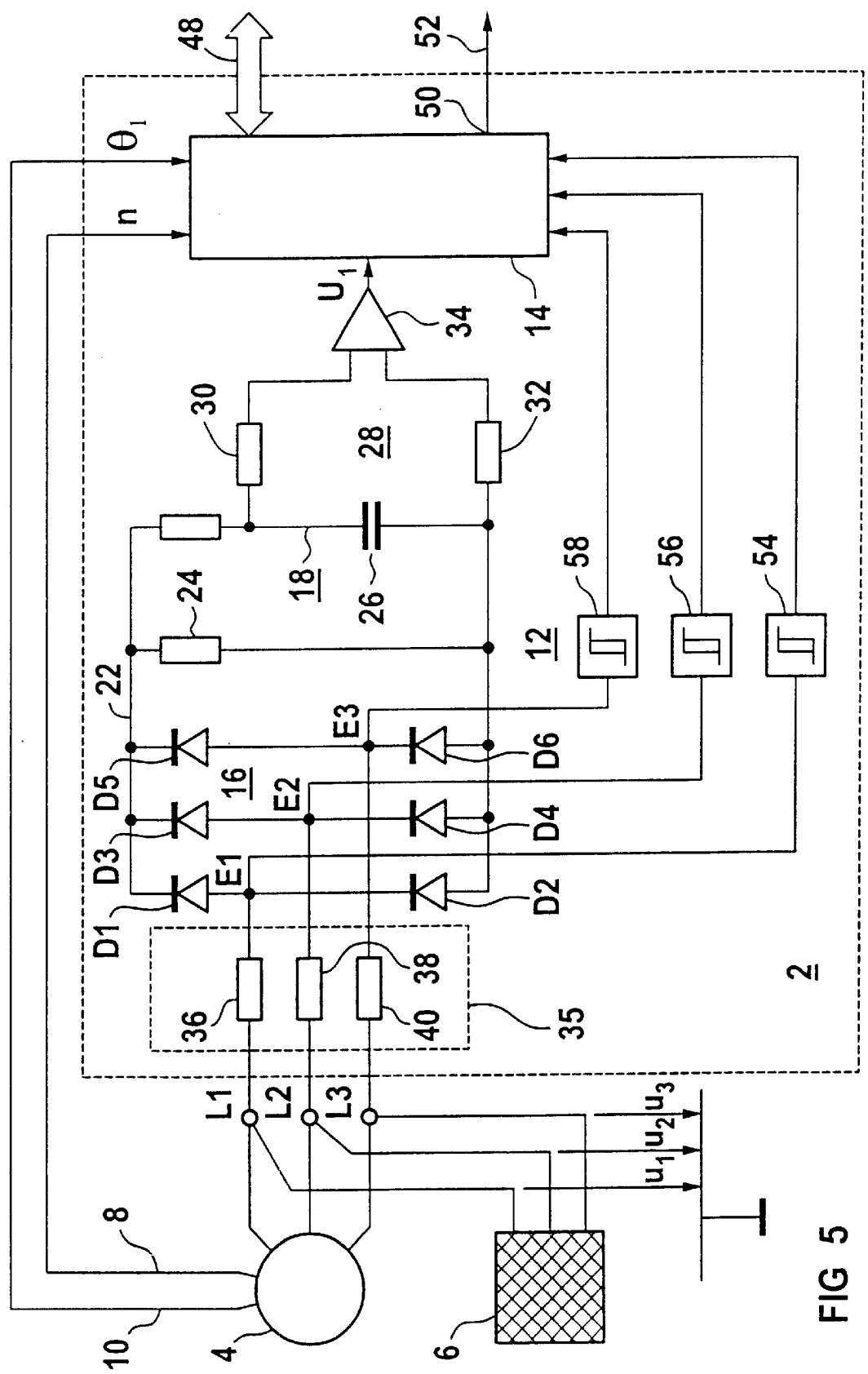
Figure 7:
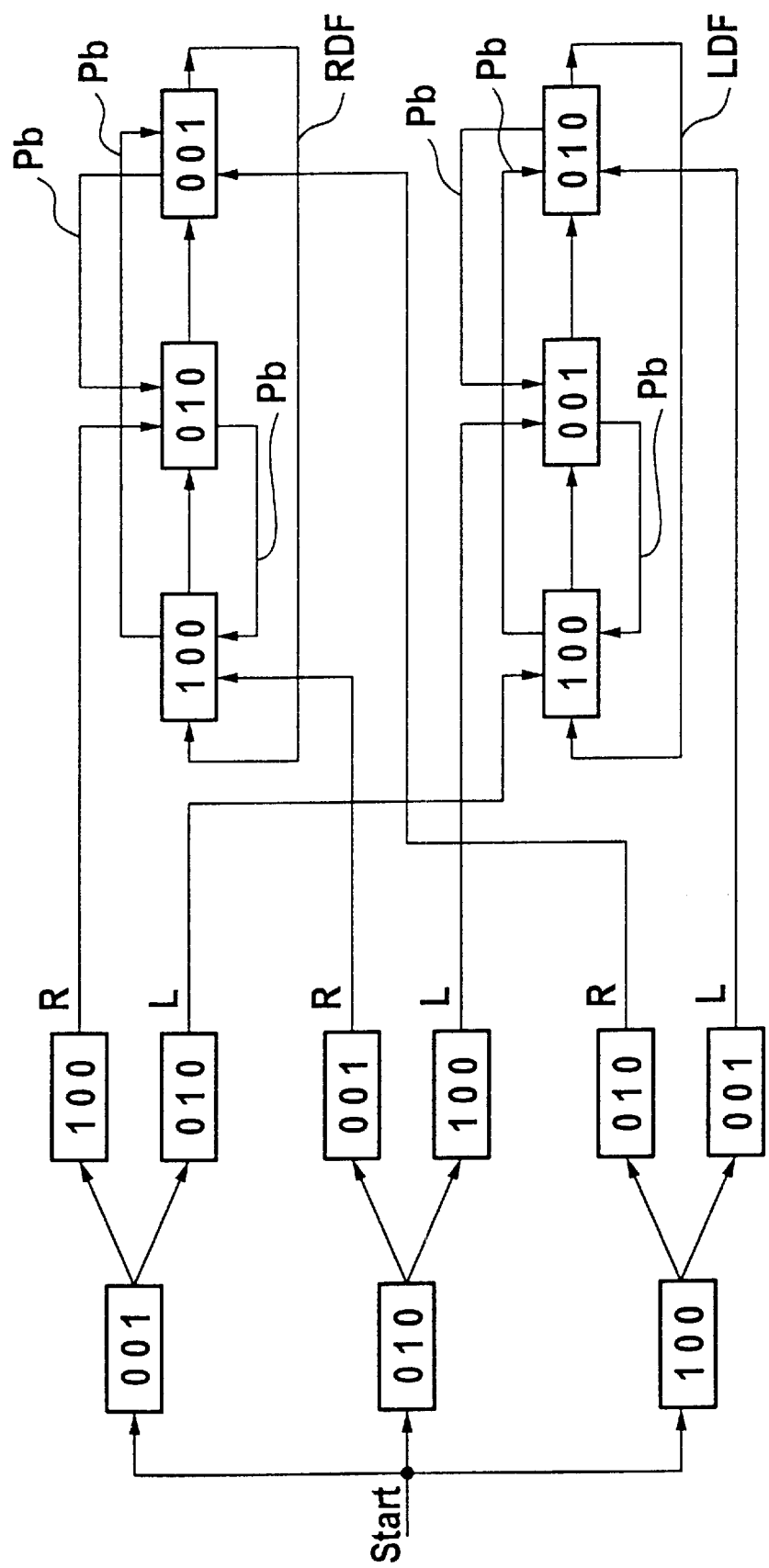
Figure 8:
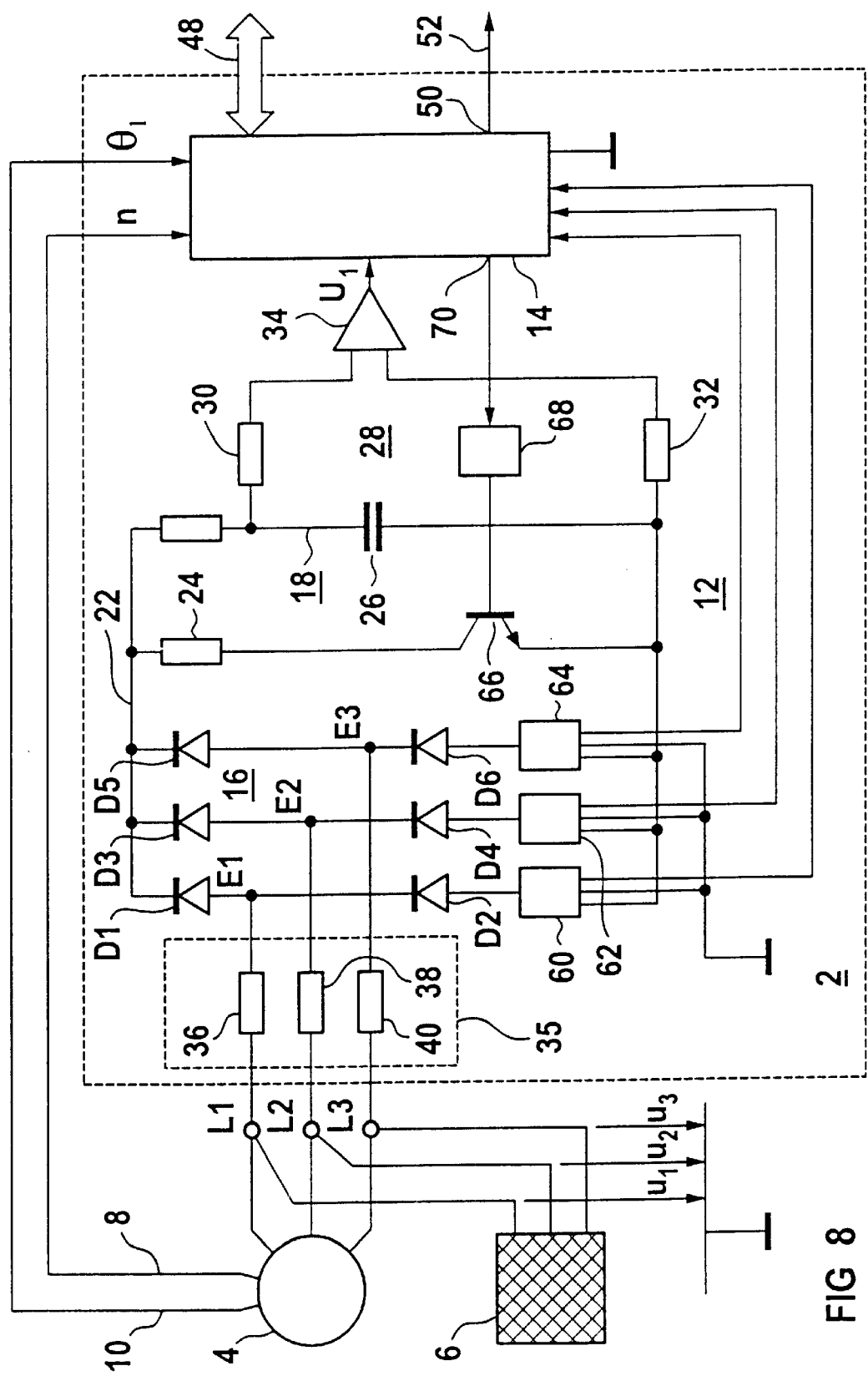
Figure 10:
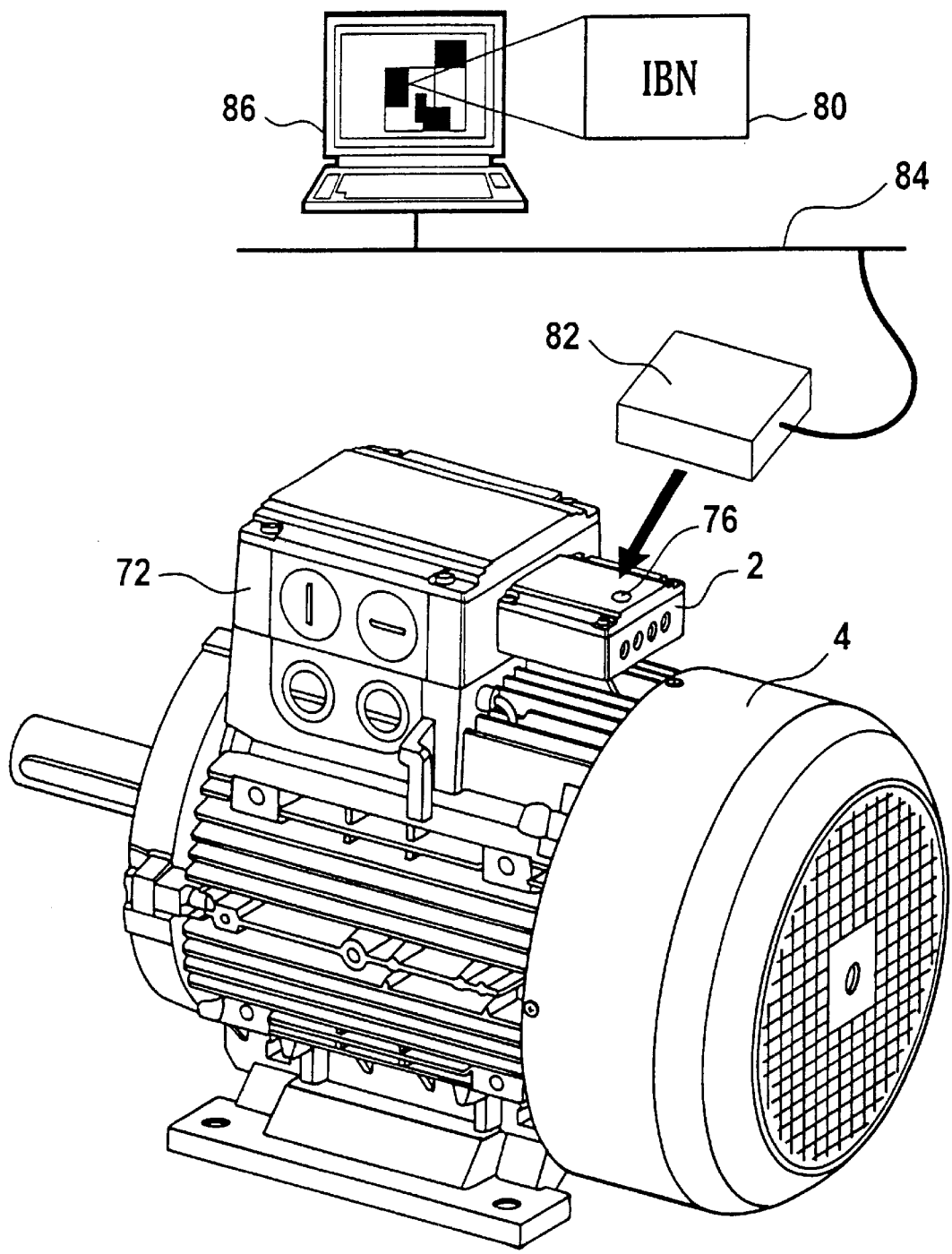

FIG. 1 shows a first embodiment of the apparatus for determining an operating state of a motor, FIG. 2 shows the phase voltages of the rigid network plotted on a graph against time t, FIG. 3 shows a ripple signal on the rectified network voltage in a graph against time t, FIG. 4 shows a single-phase equivalent circuit of a motor, FIG. 5 shows a further embodiment of the apparatus shown in FIG. 1, FIG. 6 shows the block currents in the three-phase diode bridge in the apparatus shown in FIG. 1, FIG. 7 shows a state diagram for determining whether the motor is running clockwise or counterclockwise, FIG. 8 shows a further embodiment of the apparatus shown in FIG. 1, FIG. 9 shows a motor with a low shaft axis height with the first apparatus according to the invention, and FIG. 10 shows a motor with a greater shaft axis height with an apparatus according to the invention.

FIG. 1 shows a first embodiment of an apparatus 2 for determining an operating state of a motor 4 connected to a rigid network 6, according to the invention. The motor 4 has a rotation speed sensor which, for example, is arranged in the motor 4. There are two signal lines 8 and 10 from the motor 4, for a measured shaft rotation speed n and a measured temperature $\theta_1$, which is determined by means of a temperature sensor fitted in the winding of the stator of the motor 4. The motor 4 is linked by means of its connecting terminals L1, L2 and L3 to the phase lines of the rigid network 6. The apparatus 2 is likewise connected on the input side to these connecting terminals L1, L2 and L3. The apparatus 2 has an analog evaluation circuit 12 and a digital computation unit 14. The analog evaluation circuit 12 forms the input of the apparatus 2, whose inputs E1, E2 and E3 are connected to the connecting terminals L1, L2 and L3 of the motor 4. The signal lines 8 and 10 of the motor 4 are linked to a respective signal input of the digital computation unit 14. On the output side, the analog evaluation circuit 12 is likewise connected to signal inputs of the digital computation unit 14.

The analog evaluation circuit 12 has, on the input side, a polyphase diode bridge 16, which in this case is in the form of a three-phase bridge. On the output side, this analog evaluation circuit 12 has an RC element 18 and a device 20 for suppressing any DC component. The RC element 18 is electrically connected in parallel with the DC-voltage-side output of the polyphase diode bridge 16, with the device 20 being connected on the input side to a positive connection 22 of the DC-voltage-side output of the polyphase diode bridge 16, in order to suppress any DC components. A high-value resistor 24 is connected electrically in parallel with the DC-voltage-side output of the polyphase diode bridge 16, and hence also electrically in parallel with the RC element 18. If this high-value resistor 24 were not present, there would be no ripple signal $U_{Rip}$ at the positive connection 22 of the DC-voltage-side output of the polyphase diode bridge 16, since the rectified voltage is smoothed by the RC element 18. The disadvantage of this high-value resistor 24 is that it makes the analog evaluation circuit 12 lossy.

The capacitor 26 in the RC element 18 is connected in parallel with a level converter 28, whose output is linked to a signal input of the digital computation unit 14. This level converter 28 has two high-value resistors 30 and 32 and an output amplifier 34. The two inputs of this output amplifier 34 are connected via the respective one of these high-value resistors 30 and 32 to one connection of the capacitor 26 in the RC element 18. A signal which is directly proportional to the amplitude $U_1$ of the network voltage u is produced at the output of this level converter 28.

A device 35 is provided for safe electrical isolation of the analog evaluation circuit 12, together with the downstream digital computation unit 14, from the rigid network 6. In the embodiment shown in FIG. 1, this device 35 for safe isolation has high-value series resistors 36, 38 and 40, which are connected between the connecting terminals L1, L2 and L3 of the motor 4 and the inputs E1, E2 and E3 of the analog evaluation circuit 12. Instead of having the three high-value series resistors 36, 38 and 40, the device 35 for safe electrical isolation may have a polyphase transformer or else three single-phase transformers. Furthermore, the device 35 may also have a level converter. The user must decide which embodiment of the device 35 is used, depending on whether, for example, he must use the series resistors 36, 38 and 40, for space reasons, and must accept the resultant power loss for doing so. In the respective embodiment of the apparatus 2 according to the invention for determining an operating state of a motor 4 which is connected to a rigid network 6, as shown in FIGS. 1, 5 and 8, the device 35 is in each case illustrated in the embodiment with series resistors 36, 38 and 40.

The device 20 for suppressing any DC components has a capacitor 42 on the input side, for blocking any DC component, and has a trigger circuit 44 on the output side, whose input side is connected to one connection of the capacitor 42. A ripple signal $U_{Rip}$, which is supplied to the digital computation unit 14, is produced at the output of the trigger circuit 44.

The digital computation unit may have an interface 46 (serial or parallel), via which motor-specific parameters- main inductance $X_h$, stator inductance $X_1$, rotor inductance $X_2$, rotor resistance $R_2$, stator resistance $R_1$, control $\sigma$, number of pole pairs p, temperature coefficients $\kappa_1$, $\kappa_2$—are read to the digital computation unit 14. Furthermore, this digital computation unit 14 has a further interface 48 (serial or parallel) to which a standard bus system, such as Profibus, Ethernet and ASI, can be connected. The digital computation unit 14 may be a microcomputer or a microprocessor, or else a miniature PC, for example a single-chip PC. Furthermore, the digital computation device 14 may be a Programmable Logic Device (PLD). Irrespective of the embodiment of the digital computation unit 14, it has at least one non-volatile memory for storing motor-specific parameters $X_1$, $X_2$, $X_h$, $R_1$, $R_2$, $\sigma$, p, $\kappa_1$, $K_2$, a read-only memory in which the program for the digital computation unit 14 is stored, and a random-access memory, which is used as the main memory for the digital computation unit 14. Furthermore, the digital computation unit 14 has a signaling output 50, to which a signaling line 52 can be connected. This signaling line 52 connects, for example, this apparatus to a switching device on the motor 14, or to a higher-level control system.

The method of operation of this apparatus 2 for determining an operating state of a motor 4 which is connected to a rigid network 6 will now be described in the following text:

The phase voltages $u_1$, $u_2$ and $u_3$ of the rigid network 6 which are applied to the connecting terminals L1, L2 and L3 of the motor 4 are also connected, via DC isolation, to the inputs E1, E2 and E3 of the analog evaluation circuit 12. The polyphase diode circuit 16 on the input side of the analog evaluation circuit 12 rectifies these phase voltages $u_1$, $u_2$ and $u_3$, which are plotted against time t in the graph in FIG. 2. This rectified voltage U is produced at the positive connection of the DC-voltage-side output of the polyphase diode bridge 16 and, as shown in the illustration in FIG. 3, has a DC component $\overline{U}$ and a ripple $u_{Rip}$. The DC component $\overline{U}$ is suppressed by means of the device 20, and the residual ripple $u_{Rip}$ is passed on, triggered, to the digital computation unit 14. The rectified network voltage is also applied to the RC element 18, which smoothes this rectified network voltage. This smoothed signal is passed on to the digital computation unit 14 by means of the level converter 28. This smoothed signal is directly proportional to the amplitude of the network voltage u and, assuming the phase voltages $u_1$, $u_2$ and $u_3$ are sinusoidal, is also directly proportional to its root mean square value.

The motor-specific parameters $X_1$, $X_2$, $X_h$, $R_1$, $R_2$, $\sigma$, p, and the measured values for the shaft rotation speed n and the temperature $\theta_1$ of the stator, the temperature coefficient $\kappa_1$ for the stator, the temperature coefficient $\kappa_2$ for the rotor, the root mean square value U1 of the network voltage u and the ripple signal $u_{Rip}$ are now read in the digital computation unit 14. The network frequency $f_N$ is determined first of all as a function of the ripple signal $u_{Rip}$, by counting the ripples. The number of ripples in each counting period divided by the constant 6 gives the network frequency $f_N$. The synchronous rotation speed $n_s$ of the motor 4 is calculated in accordance with the following equation:

$$n_s = \frac{f_N \cdot 60}{p} \quad (1)$$

as a function of this network frequency $f_N$ and the number of pole pairs p in the motor 4. This synchronous rotation $n_s$ and the measured shaft rotation speed n are used to calculate the slip s of the motor 4 in accordance with the following equation:

$$n_s = \frac{n_s - n}{n_s} \quad (2)$$

The single-phase equivalent circuit of the motor 4 as shown in FIG. 4 and the known motor-specific parameters $X_1, X_2, X_h, R_1, R_2$ and σ together with the calculated slip s and the determined root mean square value $U_1$ of the network voltage u now allow the stator current $I_1$ in the motor 4 to be calculated. A voltage $U_{11}$ is calculated as function of this calculated stator current $I_1$, of the determined network voltage $U_1$ and of the stator resistance $R_1$, which is read in as a parameter, and this voltage $U_{11}$ is less than the network voltage $U_1$ and the voltage drop across the stator resistance $R_1$. For this reason, this voltage $U_{11}$ is also referred to as the internal voltage of the motor 4. The mechanical shaft power $P_{mech}$ is calculated, for example, in accordance with the following equation:

$$P_{mech} = 3 \cdot X_h^2 / X_1^2 \cdot U_{11}^2 \cdot R_2 \cdot s / (R_2^2 + (\sigma \cdot X_2 \cdot s)^2) \cdot (1-s) \quad (3)$$

using the determined values $U_{11}$, $n_s$ and s and the motor-specific parameters $X_1, X_2, X_h, R_2$, σ which have already been read in. The operating state of the motor 4 is determined by means of the value of this mechanical shaft power $P_{mech}$.

The calculated stator current $I_1$ can now be used to calculate the power loss $P_{V1}$ in the stator of the motor 4, which is composed of the ohmic losses and the iron losses.

The ohmic losses $P_{1V1}$ are calculated in accordance with the following equation:

$$P_{1V1} = 3 \cdot R_1 \cdot (|I_1|)^2 \quad (4)$$

The air gap power $P_{LS}$ of the motor 4 is calculated as a function of the mechanical shaft power $P_{mech}$ and the slip s in accordance with the following equation:

$$P_{LS} = P_{mech}/(1-s) \quad (5)$$

and hence the power loss $P_{V2}$ in the rotor is calculated, in conjunction with the slip s, in accordance with the following equation:

$$P_{V2} = P_{LS} \cdot s \quad (6)$$

The iron losses are calculated in accordance with the following equation:

$$P_{Fe} = 3 \cdot |U_1| \cdot |I_1| \cdot \cos\phi(s) - P_{1V1} - P_{V2} - P_{mech} \quad (7)$$

with the power factor cosφ being calculated in accordance with the following equation:

$$\cos\phi = \cos(\phi_u - \phi_i) \quad (8)$$

where $\phi_u$ = phase angle of the network voltage $U_1$
$\phi_i$ = phase angle of the motor current $I_1$ The efficiency η of the motor 4 can be calculated as a function of the slip s using these previously calculated power levels $P_{V1}$, $P_{V2}$ and $P_{mech}$. This calculated efficiency η is also an element of the operating state of the motor 4.

Since the parameters stator resistance $R_1$ and rotor resistance $R_2$ are temperature-dependent, it is advisable to readjust these parameters as a function of the operating point. This is done using the measured temperature $\theta_1$ of the stator of the motor 4. This measured temperature $\theta_1$ and a thermal model of the motor 4 can be used to calculate the temperature $\theta_2$ of the rotor of the motor 4. The temperature-dependent parameters in the form of the stator resistance $R_1$ and the rotor resistance $R_2$ can now be corrected, as a function of the operating point, in accordance with the following equation:

$$R(T) = R_{20} \cdot (1 + \kappa \cdot (T - T_{20})) \quad (9)$$

The temperature coefficients $\kappa_1$ and $\kappa_2$ for the stator and rotor, respectively, of the motor 4, have been read, together with the motor-specific parameters, in the digital computation unit 14. Since the temperature-dependent parameters comprising the stator resistance $R_1$ and rotor resistance $R_2$ have now been corrected as a function of the operating point, the mechanical shaft power $P_{mech}$ is always calculated exactly.

It is now also possible to determine a phase failure of the network 6 as a function of the ripple signal $u_{Rip}$ using the apparatus 2 for determining an operating state of a motor 4. If one phase of the network 6 fails for any reason, then one of the three phase voltage $u_1$, $u_2$ and $u_3$ fails at the connecting terminals L1, L2 and L3 of the motor 4. The ripple signal $u_{Rip}$ thus has gaps, which are identified by the digital computation unit 14. It is thus possible to determine the faulty phase.

FIG. 5 shows one advantageous embodiment of the apparatus 2 shown in FIG. 1 in more detail. This advantageous embodiment differs from the embodiment shown in FIG. 1 in that trigger circuits 54, 56 and 58 are provided instead of the device 20 for suppressing any DC components, corresponding to the number of phases in the polyphase diode bridge 16. These trigger circuits 54, 56 and 58 are respectively connected on the input side to an input E1, E2 and E3 of the analog evaluation circuit 12, which are at the same time inputs on the AC-voltage side of the polyphase diode bridge 16. On the output side, these trigger circuits 54, 56 and 58 are each connected to a signal input of the digital computation unit 14. The graph in FIG. 6 shows the currents through the individual diodes D1, . . . , D6 in the polyphase diode bridge 16 plotted against time t. The inverse signals to these are proportional to the voltage drops across the diodes D1, . . . , D6 in this polyphase diode bridge 16. The trigger circuits 54, 56 and 58 are used to determine these voltage drops across the diodes D2, D4 and D6 in the lower bridge arm of the polyphase diode bridge 16. The digital computation unit 14 assesses not only these voltage drops but also their time sequence. The trigger circuits 54, 56 and 58 are designed such that, in the event of phase failure, the potential between the associated upper and lower diode D1, D2 or D3, D4 or D5, D6 always assumes a predetermined potential. The digital computation unit 14 can thus use the assessment of the determined voltage drops to identify whether a phase failure has occurred, and in which phase of the network 6 this phase failure has occurred. The motor 4 continues to rotate despite the occurrence of a phase failure; the only difference is that it can no longer be started. However, this results in an increase in the temperature in the stator winding.

The rotation direction of the motor 4 can be identified from the time sequence of the voltage drops across the diode D2, D4 and D6 in the diode bridge 16 in the analog evaluation circuit 12 in the apparatus 2 for determining an operating state of a motor 4. The process of determining the rotation direction of the motor 4 will be explained in more detail with reference to the state diagram shown in FIG. 7:

In this state diagram, the diodes that are carrying current are in each case denoted by one, and the reverse-biased diodes are in each case denoted by a zero. For clarity, only two clock cycles and the transitions resulting from the second clock cycle are shown, which lead to a regular response, that is to say a response without any phase failure. In principle it can be said that each transition from one state in the second clock cycle to a state other than that shown indicates a phase failure $P_b$. In order to prevent misinterpretations, the states which occur during commutation of the current from one diode to the other, and in which two diodes conduct currents at the same time, must be masked out. At least in the steady-state, the symmetry of the network can also be deduced, to a certain extent, by measuring the duration for which the respective diode conducts current.

Either the diode D2, D4 or D6 conducts current in the first clock cycle after the start in this state diagram. If it is assumed that the diode D2 in the polyphase diode bridge 16 is conducting current, then the state in the first clock cycle is 100. Only the states 010 and 001 can occur after commutation. The state 010 indicates that the diode D4 is conducting current while, in contrast, the state 001 indicates that the diode D6 is conducting current. This means that the change from the state 100 to the state 010 signal a residual rotating field RDF, and the change from the state 100 to the state 001 signals a counterclockwise rotating field LDF. This state diagram shows each of the three states for a clockwise and counterclockwise rotating field RDF and LDF in the motor 4. Any change in the sequence of these three states of a clockwise or counterclockwise rotating field RDF or LDF, respectively, signals a phase failure Pb.

FIG. 8 shows one particularly advantageous embodiment of the apparatus 2 in more detail. This embodiment differs from the embodiment shown in FIG. 5 in that the trigger circuits 54, 56 and 58 are replaced by optocouplers 60, 62, 64. These optocouplers 60, 62, 64 are each connected electrically in series, on the transmission side, with a diode D2, D4 and D6 in the lower bridge arm of the polyphase diode bridge 16 in the analog evaluation circuit 12. On the receiving side, each optocoupler 60, 62 and 64 is connected to a signal input of the digital computation unit. The use of optocouplers 60, 62 and 64 instead of the trigger circuits 54, 56 and 58 means that the final conduction states of the diodes D2, D4 and D6 are determined without any DC potential.

A further difference between this embodiment and the embodiment shown in FIG. 5 is that an electrical switch 66 is electrically connected in series with the high-value resistor 24. The control input of this electrical switch 66 is linked, in a DC-decoupled manner, by means of an optocoupler 68 to a control output 70 of the digital computation unit 14. In this electrical switch 66, which in this case is a transistor, the high-value resistor 24 is electrically connected in parallel with the DC-voltage-side output of the polyphase diode bridge 16. Whenever the high-value resistor 24 is connected, a current flows through the diodes D1, . . . , D6. In order to allow the rotation direction of the motor 4 and a phase failure to be detected, the current does not need to flow during a complete 60° electrical block for each diode D1, . . . , D6. A fraction of each 60° electrical current block is sufficient. The magnitude of this fraction governs the reduction in the power loss that occurs in the high-value resistor 24. If these fractions of the 60° electrical current blocks are each synchronized to the positive and negative commutation times Kp and Kn (natural commutation points in a three-phase network), respectively, then it is also possible to determine the network frequency $f_N$, in addition to identifying the rotation direction. This pulsed high-value resistor 24 can also be used in the embodiments shown in FIGS. 1 and 5.

FIG. 9 shows a motor 4 with a low shaft axis height, with an apparatus 2 as shown in FIGS. 1, 5 and 8. This apparatus 2 is arranged in the terminal box 72 on this motor 4, so that the apparatus 2 is permanently associated with the motor 4. This apparatus 2 can thus not be fitted to a different motor 4. In order to protect this apparatus 2 against being opened by unauthorized personnel, it is integrated in the terminal box 72 as a sealed unit, and/or is mounted on the terminal box 72 as shown in FIG. 10. The rotation speed sensor and the temperature sensor are advantageously wired up in the interior of the motor 4. Appropriate apertures must be provided in the laminated core of the motor 4 for this purpose, in order to pass the sensor line from the non-drive end of the motor into the terminal box 72. The communication assembly 74 is not a component of the apparatus 2. This communication assembly 74 is designed such that it can be plugged onto the housing of the apparatus 2. The plug connection 76 is sealed with a cover when the assembly 74 has been pulled off. The apparatus 2 is connected by means of this communication assembly 74 to a programming device 78, which has a programming tool 80. The apparatus 2 for the motor 4 is configured by means of this programming device 78. Furthermore, additional parameters can be stored for a machine that is being driven. This communication assembly 74 is removed from the apparatus 2 once the configuration process has been completed. Such a motor 4 with a permanently associated apparatus 2 may be referred to as an "intelligent" motor, since the apparatus 2 determines the operating state of the motor 4 and, in the event of an unacceptable operating state, emits a message via the signaling line 52 to a local controller, or else uses this signaling line 52 to operate a contactor in order, if appropriate, to disconnect the motor 4 by interrupting the control circuit for the main contactor.

FIG. 10 shows a motor 4 with a high shaft axis height, with an apparatus 2 as shown FIGS. 1, 5 and 8. In this illustration, the apparatus 2 is fitted directly to the terminal box 72 of the motor 4. In this illustration, the apparatus 2 is configured by means of a bus connection assembly 82. This bus connection assembly 82 is plugged onto the apparatus 2, in the same way as the communication assembly 74. In contrast to the embodiment shown in FIG. 9, the bus connection assembly 82 is connected to a bus system 84 which has a central control device 86. This control device 86 likewise has a programming tool 80. This bus connection assembly 82 means that the "intelligent" motor 4 is connected to the central control device 86 all the time.

I claim:

1. A method for determining an operating state of a motor which is connected to a rigid network and has a rotation speed sensor, with the phase voltages of the rigid network which are applied to the connecting terminals of the motor being used to determine its frequency $f_N$ and amplitude, with a measured shaft rotation speed and a number of pole pairs of the motor being used to determine the slip of the motor as a function of the determined network frequency, with an amplitude of a voltage which corresponds to the amplitude of the network minus the voltage drop across the stator resistance being calculated as a function of this slip (s), of a determined amplitude of the network and of predetermined motor-specific parameters and with a mechanical shaft power being calculated in accordance with the following equation:

$$P_{mech}=3 \cdot X_h^2/X_1^2 \cdot U_{11}^2 \cdot R_2 \cdot s/ (R_2^2+(\sigma \cdot X_2 \cdot s)_2) \cdot (1-s)$$

as a function of these previously calculated values.

2. The method according to claim 1, with the motor current being calculated as a function of the motor-specific parameters of the calculated slip (s) of the motor of the determined amplitude of the rigid network and of the single-phase equivalent circuit of the motor.

3. The apparatus according to claim 2, with the analog evaluation circuit having a polyphase diode bridge on the input side and an RC element on the output side, which RC element is connected on the input side electrically in parallel with the high-impedance short-circuited output of the polyphase diode bridges, and with each input of the analog evaluation circuit being connected to an input of a trigger circuit which is in each case connected on the output side to an input of the digital computation unit.

4. The apparatus according to claim 3, with the resistance of the high-impedance short-circuited output of the polyphase diode bridge being electrically connected in series with an electrical switch, whose control input is connected, with DC-decoupling, to an output of the digital computation unit.

5. The apparatus according to claim 3, with the RC element having a level converter on the output side.

6. The apparatus according to claim 2, with the analog evaluation circuit having a polyphase diode bridge on the input side and an RC element on the output side, which RC element is connected on the input side electrically in parallel with the high-impedance short-circuited output of the polyphase diode bridge, and with the diodes in the upper or lower diode arm each being electrically connected in series with an optocoupler whose signal outputs are each connected to an input of the digital computation unit.

7. The method according to claim 1, with the time sequence of determined voltage sections of the phase voltages of the rigid network which are applied to connecting terminals of the motor being evaluated in order to determine the rotation direction of the network at the connecting terminals of the motor.

8. The method according to claim 1, with the time sequence of determined voltage sections of the phase voltages of the rigid network which are applied to connecting terminals of the motor being evaluated, and the amplitude of these voltage sections being evaluated, in order to determine a phase failure in the network.

9. The method according to claim 1, with stalling of the motor being deduced as a function of the measured shaft rotation speed and the determination of the rotating field of the rigid network.

10. The method according to claim 1, with the airgap power being calculated in accordance with the following equation:

$$P_{LS}=P_{mech}/(1-s)$$

as a function of the calculated slip (s) and of the calculated mechanical shaft power.

11. The method according to claim 10, with the power loss in the rotor of the motor being calculated in accordance with the following equation:

$$P_{V2}=P_{LS} \cdot s$$

as a function of the calculated slip (s) of the motor and of the calculated airgap power.

12. The method according to claim 11, with the power loss in the stator of the motor being calculated as a function of the calculated motor current and of the motor-specific parameters.

13. The method according to claims 11 and 12, with the real power consumed by the motor being determined as a function of the mechanical shaft power and of the measured shaft rotation speed, from which the efficiency of the motor is then determined as a function of the calculated power losses in the stator and in the rotor.

14. The method according to claim 1, with a measured temperature of the stator and a thermal model of the motor being used to determine the temperature of the rotor.

15. The method according to claim 14, with the motor-specific parameters being corrected in accordance with the following equation:

$$R(T)=R_{20} \cdot (1+\kappa \cdot (T-T_{20}))$$

as a function of the stator and rotor temperatures and of predetermined temperature coefficients.

16. An apparatus for determining an operating state of a motor which is connected to a rigid network and has a rotation speed sensor, with this apparatus having a digital computation unit and an analog evaluation circuit whose inputs are linked to the connecting terminals of the motor and which is linked on the output side to inputs of the digital computation unit with the rotation speed sensor being connected on the output side to an input of the digital computation unit.

17. The apparatus according to claim 16, with the analog evaluation circuit having a polyphase diode bridge on the input side and an RC element on the output side, which RC element is connected on the input side electrically in parallel with the high-impedance short-circuited output of the polyphase diode bridge and with a positive connection of the output of the polyphase diode bridge being linked to a device for suppressing any DC component.

18. The apparatus according to claim 16, with the analog evaluation circuit having a device for safe electrical isolation connected upstream of it.

19. The apparatus according to claim 18, with the device having a high-value resistance for each input of the analog evaluation circuit.

20. The apparatus according to claim 18, with the device being a polyphase transformer.

21. The apparatus according to claim 18, with the device having a single-phase transformer for each input of the evaluation circuit.

22. The apparatus according to claim 18, with the device being a level converter.

23. The apparatus according to claim 16, with a temperature sensor being arranged in a stator winding of the motor and being linked on the output side to an input of the digital computation unit.

24. The apparatus according to claim 16, with the rotation speed sensor being fitted in the interior of the motor.

25. The apparatus according to claim 16, with the rotation speed sensor being a simple bar encoder.

26. The apparatus according to claim 16, with the rotation speed sensor being a toothed wheel encoder.

27. The apparatus according to claim 16, with the digital computation unit being a microprocessor.

28. The apparatus according to claim 16, with the digital computation unit being a programmable logic device.

29. The apparatus according to claim 16, with the apparatus being fitted directly on the motor.

30. The apparatus according to claim 28, with the apparatus and the terminal box of the motor forming a unit.

31. The apparatus according to claim 16, with the apparatus being configured with access-protection.

32. The apparatus according to claim 16, with the apparatus having a plug connection for making contact with a further unit.

33. The apparatus according to claim 32, with the further unit being a communication assembly.

* * * * *